United States Patent

Ohtsuki et al.

[11] Patent Number: 5,327,454
[45] Date of Patent: Jul. 5, 1994

[54] BRIDGE FOR CONNECTING CORES IN A MANUFACTURING EQUIPMENT OF POLYCRYSTAL SILICON

[75] Inventors: Minoru Ohtsuki; Yusuke Miyamoto, both of Hiratsuka; Kenichi Nagai, Tokyo, all of Japan

[73] Assignee: Komatsu Electronic Metlas Co., Inc., Japan

[21] Appl. No.: 849,450

[22] PCT Filed: Oct. 25, 1990

[86] PCT No.: PCT/JP90/01373
§ 371 Date: Apr. 27, 1992
§ 102(e) Date: Apr. 27, 1992

[87] PCT Pub. No.: WO91/06507
PCT Pub. Date: May 16, 1991

[30] Foreign Application Priority Data

Nov. 4, 1989 [JP] Japan .................. 1-286040

[51] Int. Cl.[5] .............. H05B 3/14; C23C 13/08
[52] U.S. Cl. .................. 373/133; 373/109; 373/117; 422/244
[58] Field of Search ........... 373/133, 134, 135, 132, 373/109, 117; 437/233, 255.1, 255.2, 202, 159; 156/611, 613, 606 OR; 422/250, 249, 246, 199, 244; 427/74, 85, 86, 429; 75/686; 423/346; 148/DIG. 16; 357/63; 118/49.5

[56] References Cited

U.S. PATENT DOCUMENTS

| | | | |
|---|---|---|---|
| 3,011,877 | 12/1961 | Schweickert et al. | 422/199 |
| 3,446,653 | 5/1969 | Reuschel et al. | 156/606 |
| 3,476,640 | 11/1969 | Sirtl et al. | 427/429 |
| 3,919,968 | 11/1975 | Sandmann et al. | 118/5 |
| 3,930,067 | 12/1975 | Gorrissen | 427/86 |
| 3,941,900 | 3/1976 | Stut et al. | 427/86 |
| 3,950,602 | 4/1976 | Korsten et al. | 373/133 |
| 4,068,020 | 1/1978 | Reuschel | 427/85 |
| 4,237,151 | 12/1980 | Strongin et al. | 427/74 |
| 4,500,402 | 2/1985 | Miles et al. | 156/86 |
| 4,619,811 | 10/1986 | Nishizawa | 422/109 |
| 4,666,681 | 5/1987 | Ferrand et al. | 373/156 |
| 4,870,033 | 9/1989 | Hotta et al. | 437/202 |
| 4,935,072 | 6/1990 | Nguyen-Dinh | 148/162 |
| 4,956,153 | 9/1990 | Yamagishi et al. | 422/249 |
| 5,102,745 | 4/1992 | Tatarchuk et al. | 428/605 |

FOREIGN PATENT DOCUMENTS 14-25899 11/1939 Japan .
53-12358 4/1978 Japan .
55-23457 6/1980 Japan .

Primary Examiner—Bruce A. Reynolds
Assistant Examiner—Tu Hoang
Attorney, Agent, or Firm—Mason, Fenwick & Lawrence

[57] ABSTRACT

In a equipment for manufacturing polycrystal silicon by depositing it on filament cores electrically heated, by means of thermal decomposition of monosilane gas, a bridge for connecting said filament cores is constituted by tantalum, molybdenum, tungsten or zirconium. Preferably the sectional shape of the connection bridge may be of upturned triangle, tear droplet or rectangle.

3 Claims, 2 Drawing Sheets

BRIDGE FOR CONNECTING CORES IN A MANUFACTURING EQUIPMENT OF POLYCRYSTAL SILICON

TECHNICAL FIELD

This invention relates to a technique for providing polycrystal silicon which is of less grinding loss and which is used for a material of manufacturing a semiconductor silicon single crystal according to floating zone process (hereinafter referred to as the FZ process), and more particularly to a bridge for connecting cores which are electrically heated in a thermal decomposition equipment.

BACKGROUND ART

As the technology in the semiconductor field develops there are demanded semiconductor single crystals which are manufactured according to the FZ process, particularly silicon single crystals, having larger diameter, and at present even such single crystals as having 6 inch diameter are manufactured. The diameter of polycrystal silicon to be a rod for obtaining single crystals of such a large diameter is not necessarily the same as that of a single crystal to be obtained because, for example, in the case of using a slender rod, it is possible to enlarge the diameter of the rod due to the technique with a stuffing operation. However, the smaller in diameter the more the longer rod is required, and a problem of charging the longer rod into the FZ machine arises, so that a blank having a diameter almost same as that of the single crystal intended to obtain is required.

As are disclosed in Japanese Patent Publication Nos. 12358/78 and 23457/80, the polycrystal silicon to be a rod for manufacturing a silicon single crystal is obtained in such a way that for example, a monosilane gas is supplied onto electrically heated filament cores and then thermally decomposed for deposition thereon. If it is intended to obtain polycrystal silicon which is crushed for use, it is most general for a bridge for electrically connecting filament cores in the manufacturing equipments to use silicon materials described in said publication by using the carbon referred to in Publication No. 23457/80 even from the viewpoints of preventing the bridge from contamination by heterogeneous material and of subsequent processing.

In such a case of using silicon materials, polycrystal silicon deposits on the filament cores and the connection bridge to the same amount as the polycrystal silicon. However, as shown in FIG. 4 (II), as the deposition develops and the connection bridge portion thickens, the gas flow within the thermal decomposition furnace varies, the polycrystal silicon which deposits on the filament cores is deformed particularly in the neighbourhood of the joints of the connection bridge with the filament cores, when said joints become slender than other portions and at the same time the initial central axis is moved. A polycrystal silicon rod used in the FZ process needs to be of uniform diameter, so that when such a rod is used in the FZ process deposition must be continued until the slender portions increase their diameter to satisfaction, and then the outer diameter of the rod must be ground so as to obtain a predetermined diameter. Naturally, the larger the diameter, the more the grinding loss increases even in the same grinding ratio, and the more the diameter into a rod changes, the more the grinding loss increases.

Referring to the grinding of the outer diameter, it does not answer the purpose that the outer periphery of the rod becomes uniformly thick, but the rod is ground up to a predetermined diameter so that the resistivity of the intended single crystal may become a predetermined value. Such grinding is employed in any case of embedding or coating of impurities to the outer surface of a polycrystal rod, doping by gaseous impurities, and control between the resistivity of the filament cores and the resistivity to a finished product whose diameter has increased to as desired.

For these reasons it is specifically necessary for polycrystal silicon used in the FZ process that the crystals are of uniform diameter from their manufacturing state in order to realize shortening of growth time, reduction of material or electric charges, reduction of processing steps, reduction of grinding loss, and the like.

However, sufficient measures for solving such problems have not so far been taken.

DISCLOSURE OF THE INVENTION

The present invention has been accomplished to solve the known problems, and it is characterized in that in the equipment of depositing polycrystal silicon on the filament cores made of electrically heated one, by means of thermal decomposition of monosilane gas, the bridge for connecting said filament cores is constituted by molybdenum, tungsten or zirconium. Preferably, the sectional shape of the connection bridge may be of upturned triangle, tear droplet or rectangle. However, the sectional shape need not to be limited to such shapes. In case a narrow bridge can be used, i.e. in case the diameter of a polycrystal silicon rod is small an effect can be produced even if the sectional shape is circular, oval or polygonal near round.

BEST MODE FOR CARRYING OUT THE INVENTION

Figure 1:
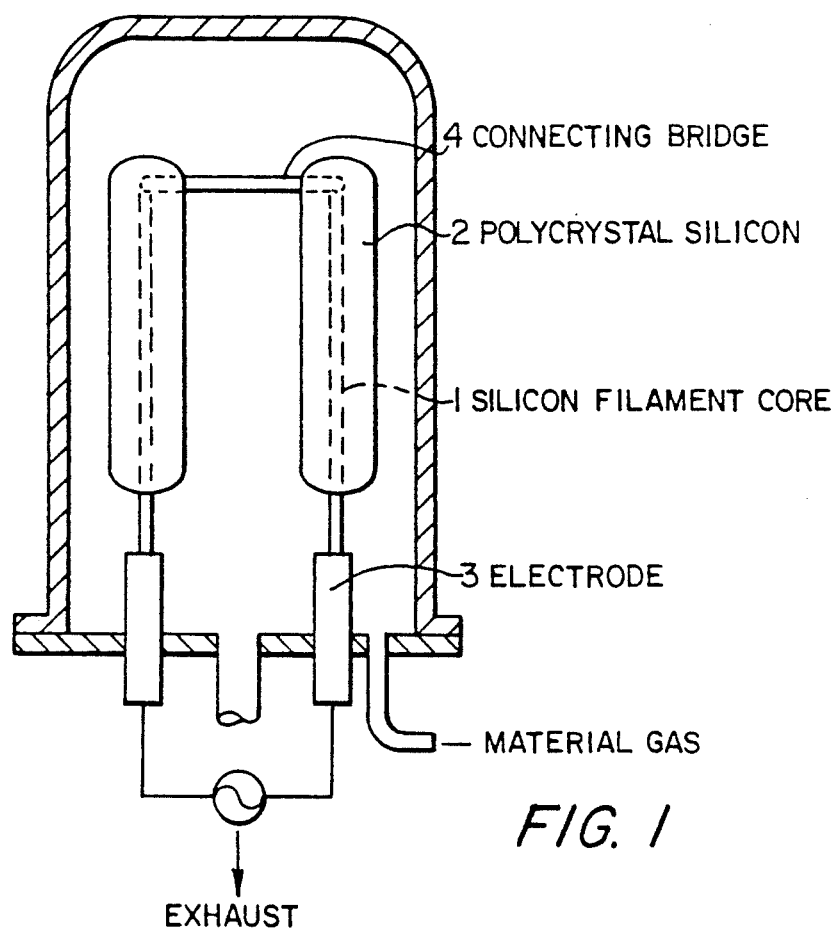
FIG. 1 is a vertical sectional view of one embodiment of the furnace for manufacturing polycrystal silicon, which employs a connection bridge according to the invention.

The connection bridge according to the invention is constituted by low electric-resistant molybdenum, tungsten or zirconium, so that even if a bridge of, for example, 7.5 mm diameter as in the known process were used, it is not heated to the decomposition temperature of monosilane gas by electric flow. Since monosilane gas is not thermally decomposition on the connection bridge, therefore, the polycrystal silicon does not deposit. That is, since the diameter of the connection bridge does not increase with time, reverse affection such as staying is not given to the flow of gas in the manufacturing furnace, and the intended polycrystal silicon deposits at a uniform diameter on the filament cores only.

Further, it is found from experiments that molybdenum, tungsten or zirconium hardly reacts with silicon at the thermal decomposition temperature (750°–950° C.) at the time of preparing polycrystal silicon by using monosilane gas, that any of said metals has low vapour pressure, is slow at diffusion rate into silicon, and does not reversely affect the characteristics of silicon.

Though Patent Publication No. 25899/64 discloses an example where a tantalum wire is used for bridge it does not describe in any way the re-use of the tantalum wire as the bridge for mass production. According to the experiments, tantalum hardly reacts with silicon, and it is of the same extend as molybdenum, tungsten and zirconium that excepting the influence by hydrogen brittleness it is a chemically stable metal. However, since the bridge of the invention is used within the equipment of manufacturing polycrystal silicon by the thermal decomposition of monosilane gas, the atmosphere is the hydrogen gas, by more than 95%. which has generated by the decomposition of the monosilane gas. Compared with molybdenum, tungsten or zirconium it is likely for tantalum that the portion where the temperature is specifically high in the bridge portion, i.e. the connection neighbourhood of the bridge with the filament cores causes a hydrogen brittleness by hydrogen gas thereby to become brittle. If the connection portion of the bridge with the filament cores is thickened, the bridge can be recyclically used, and the actual circumstances are that even such a bridge can be used only twice or three times. It is known from experiments that compared with the bridges made of molybdenum, which can be used some ten times, those made of tantalum are largely inferior. Thus, tantalum is not suitable for bridges for mass production. On the other hand, if the connection portion is thickened, the bridge becomes heavy and there occur such problems as frequently breaking the filament cores and disturbing the flow of gas within the furnace.

It has been stated above that preferably the sectional shape of the connection bridge may be of upturned triangle, tear droplet or rectangle. Adoption of such shape is because of preventing a turbulence which generates when the uprising stream in the furnace traverses the connection bridge as shown in FIG. 1.

Additionally, adoption of such shapes increases surface area compared with a round shape thereby increasing the heat radiation amount to allow the temperature to be further lowered. Lowering of temperature means possible use of further thin bridge, and it produces an effect of decreasing the turbulence of gas flow caused depending on the shape of bridge. Additionally, it results in decreasing the hindrance to the uprising gas stream, which might be caused by making the bridge narrow, to lower the temperature whereby the effect increases. Naturally, in case the polycrystal silicon rod manufactured for specific use is slender, a slender, round-shaped bridge will suffice. However, it is the recent years' tendency that it is desired year by year to enlarge the diameter of polycrystal silicon rods. This proves the usefulness of the present invention.

EXAMPLE 1

FIG. 1 shows a vertical sectional view of a furnace for manufacturing polycrystal silicon according to a thermal decomposition process of monosilane gas, which furnace is equipped with a connection bridge of the present invention.

In the drawings, reference numeral 1 designates silicon filament cores on which silicon polycrystal deposits, reference 2 polycrystal silicon deposited on the filament cores, reference 3 electrodes for electrically heating the filament cores 1, and reference 4 a bridge for connecting the filament cores 1 respectively. For the connection bridge between the filament cores a 7 mm molybdenum rod is adopted.

Figure 2A:
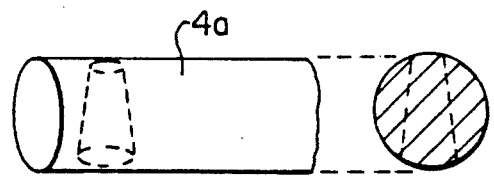
FIGS. 2(a)–(c) and FIG. 3 respectively show the shapes of the connection bridges employed in the invention.
Figures 4A, 4B:
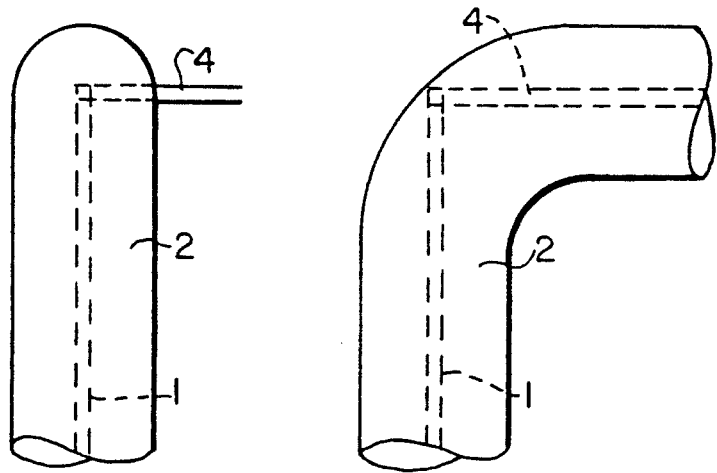
FIGS. 4(a)–(b) show the shape of the polycrystal silicon deposited near the connection portion of the connection bridge with a filament core.

By using the furnace shown in FIG. 1 and an $\phi$ 7 mm molybdenum rod shown in FIG. 2(a) for the connection bridge 4 between the filament cores, monosilane gas was supplied as material gas and the filament cores 1 were electrically heated while depositing polycrystal silicon 2 by means of thermal decomposition process. The supply amount of the monosilane gas was set so that the deposition rate may be 4–8 $\mu$/min whereby polycrystal silicon 2 having a representative 73 mm diameter was obtained. Even after the finishing of the thermal decomposition, as shown in FIG. 4 (I), deposition of polycrystal silicon was not observed on the connection bridge 4 of molybdenum. Such a connection bridge made of molybdenum was re-usable and could be continuously used for about 30 times.

Table 1 shows a comparison between the case of this Example and the known case of using silicon for the connection bridge.

Further, according to this Example, molybdenum was used for the connection bridge, and an atomic absorption spectroscopy analysis was carried out to the polycrystal silicon thus obtained. As a result, it was found that molybdenum within 0.1 ppma concentration was detected in the polycrystal silicon rods within 2 mm away from the contact portions with the connection bridge 4 but not in other portions. Furthermore, single crystal silicon was prepared, according to the FZ process, based on the polycrystal silicon as material, and any problem did not occur characteristically.

TABLE 1

|  | This Example | Known apparatus |
| --- | --- | --- |
| Diameter of connection bridge | | 7 mm |
| Length of filament core | | 2000 mm |
| Target of diameter of end product | | 73 mm |
| Diameter of product | | 74 ± 0.8 mm |
| Length of product | 1900 mm | 1800 mm |
| Power consumption | 70% | In the case of 100% |
| Amount of material gas consumption | 85% | In the case of 100% |
| Operation time | 85% | In the case of 100% |

EXAMPLE 2

$\phi$7 mm tungusten was adopted for the connection bridge 4, and in the same manner as in Example 1 polycrystal silicon was manufactured according to thermal decomposition process of monosilane gas. The result obtained was the same as in Example 1.

EXAMPLE 3

Figure 2B:
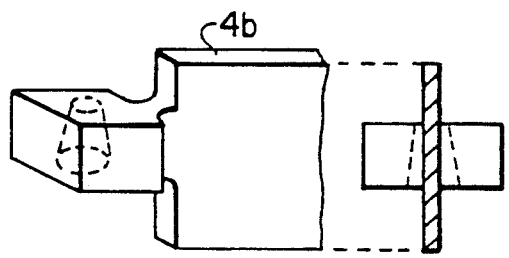

A molybdenum plate having a 2×19 mm section as shown in FIG. 2(b) was adopted for the connection bridge 4, and in the same manner as in Example 1 polycrystal silicon was prepared according to thermal decomposition process of monosilane gas. The result obtained was the same as in Example 1.

EXAMPLE 4

Figure 2C:
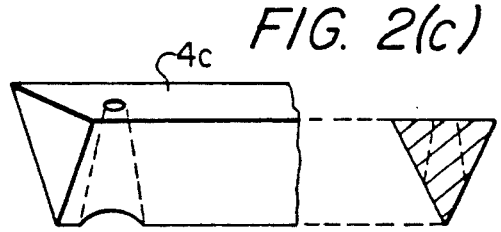

An upturned triangle-shaped molybdenum plate of 7 mm base × 10 mm height as shown in FIG. 2(c) was adopted for the connection bridge 4, and in the same manner as in Example 1 polycrystal silicon was prepared according to thermal decomposition process of monosilane gas. The result thus obtained was the same as in Example 1.

EXAMPLE 5

Figure 3:
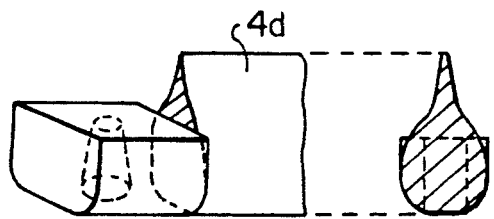

A monlybdenum plate having a tear droplet-like section as shown in FIG. 3 was adopted for the connection bridge 4, and in the same manner as in Example 1 polycrystal silicon was manufactured according to thermal decomposition process of monosilane gas. The result was such that up to about 70 mm diameter of the product it was the same as in Example 1, but for the products having greater diameter than 70 mm there could be obtained products slightly longer (+30 mm − +40 mm) than those of having adopted a bridge of round-shaped section.

Because of using low resistant molybdenum, tungsten or zirconium the connection bridge of the present invention generates less heat, so that even after the lapse of time until the polycrystal silicon depositing on the filament cores grows to a predetermined diameter, the polycrystal silicon furnace does not vary from the initial growing stage to the final stage, and a turbulence is not caused by temperature rise of increase of diameter. In case the uprising stream of the material gas near the rods is always stable, it results in that the deposition of the polycrystal silicon is rate-determined only by the moving rate of the material gas which moves onto the filament cores, and it is already known that the uniformity of diameter is good. Furthermore, the flow of the material gas is not disturbed if a connection bridge of the present invention is employed, so that it is possible to obtain polycrystal silicon having better uniform diameter.

Moreover, in using a connection bridge having a sectional shape such as upturned triangle, tear droplet or rectangle the flow of the material gas is hardly disturbed, but particularly the bridge of tear droplet shape in section produces a high effect thereby obtaining a polycrystal silicon of excellent uniform diameter.

Additionally, since silicon does not deposit on the connection bridge the material gas is less consumed and non-uniformation of the material gas concentration hardly occurs, since the bridge is scarcely affected by hydrogen brittleness the bridge can be recyclically used so many times.

For these reasons, the polycrystal silicon thus obtained does not become slender in its diameter to about the neighbourhood of the connection bridge and does not become eccentric. The length of the product is longer than those of known products, the power and material gas needed for manufacturing the polycrystal silicon rods as well as the loss at processing are saved, and even the grinding time is curtailed whereby productivity is improved.

To add, if silicon for the connection bridge as in conventional process is used, it was difficult to cut off the bridge. However, since the metallic materials employed in the connection bridge of the present invention differ from silicon in coefficient of thermal expansion the bridge can be easily cut off.

Since the bridge can be recyclically used many times the present invention contributes to resource saving and improved economy.

INDUSTRIAL FIELD OF THE INVENTION

It is possible to suitably apply the present invention to a connection bridge between filament cores in a thermal decomposition equipment for manufacturing polycrystal silicon.

We claim:

1. A bridge connecting filament cores in polycrystalline silicon manufacturing equipment, said bridge consisting essentially of a material selected from the group consisting of molybdenum, tungsten and zirconium; wherein said filament cores are capable of being electrically heated and coated with polycrystalline silicon; wherein said polycrystalline silicon is vapor deposited by the thermal decomposition of monosilane gas.

2. The bridge of claim 1 having a cross sectional shape selected from the group consisting of upturned triangle, tear droplet and rectangle.

3. The bridge of claim 2 having a cross sectional shape of tear droplet.